United States Patent
Oh et al.

(10) Patent No.: US 8,674,718 B2
(45) Date of Patent: Mar. 18, 2014

(54) BUILT OFF TESTING APPARATUS

(75) Inventors: Se-jang Oh, Seongnam-si (KR); Eun-jo Byun, Yongin-si (KR); Cheol-jong Woo, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 706 days.

(21) Appl. No.: 12/730,314

(22) Filed: Mar. 24, 2010

(65) Prior Publication Data

US 2010/0289517 A1 Nov. 18, 2010

(30) Foreign Application Priority Data

May 13, 2009 (KR) ........................ 10-2009-0041749

(51) Int. Cl.
*G01R 31/26* (2006.01)

(52) U.S. Cl.
USPC .................................................. 324/762.01

(58) Field of Classification Search
USPC ................. 324/762.01–762.1, 754.01–754.3; 257/48; 438/14–18
See application file for complete search history.

(56) References Cited

U.S. PATENT DOCUMENTS

| | | | | |
|---|---|---|---|---|
| 5,095,262 A * | 3/1992 | Henley et al. | ................. | 324/73.1 |
| 6,316,929 B1 * | 11/2001 | Yamaguchi | ................. | 324/76.53 |
| 6,400,625 B2 * | 6/2002 | Arimoto et al. | ................. | 365/201 |
| 7,171,333 B2 * | 1/2007 | Nassif | ................. | 702/179 |
| 7,395,169 B2 | 7/2008 | Vonstaudt | | |
| 7,973,550 B2 * | 7/2011 | Byun et al. | ................. | 324/762.01 |

FOREIGN PATENT DOCUMENTS

| | | |
|---|---|---|
| KR | 20040071152 | 8/2004 |
| KR | 20060035073 | 4/2006 |
| KR | 20070069616 | 7/2007 |

* cited by examiner

*Primary Examiner* — Tung X Nguyen
(74) *Attorney, Agent, or Firm* — Stanzione & Kim, LLP

(57) ABSTRACT

A built off testing apparatus coupled between a semiconductor device and an external testing apparatus to test a semiconductor device. The built off testing apparatus can include a frequency multiplying unit to generate a test clock frequency by multiplying the frequency of a clock input by the external testing apparatus according to the operation speed of the semiconductor device, an instruction decoding unit to generate test information by decoding test signals input by the external testing apparatus according to the test clock frequency, and a test execution unit to test the semiconductor device according to the test information, and can determine whether the semiconductor device is failed or not based on test data output by the semiconductor device, and can transmit resulting data to the external testing apparatus.

9 Claims, 3 Drawing Sheets

BUILT OFF TESTING APPARATUS

CROSS-REFERENCE TO RELATED APPLICATIONS

This application claims priority to Korean Patent Application No. 10-2009-0041749, filed on May 13, 2009, in the Korean Intellectual Property Office, the disclosure of which is incorporated herein in its entirety by reference.

BACKGROUND

1. Field of the Invention

The present general inventive concept relates to a built off testing apparatus, and more particularly, to a built off testing apparatus coupled between a semiconductor device and an external testing apparatus to test the semiconductor device.

2. Description of the Related Art

Generally, after being fabricated, semiconductor devices are functionally tested to evaluate electrical characteristics of the semiconductor device. For example, dynamic random access memory (DRAM) undergoes tests to detect defects in internal memory cells or to evaluate DC characteristic of the DRAM.

FIG. 1 is a block diagram of a conventional external testing apparatus 10.

Referring to FIG. 1, the external testing apparatus 10 may be coupled to a device under test (DUT) 20 by contacting probes (not illustrated) electrically connected to the external testing apparatus 10 via connection cables, to the DUT 20. Then, the DUT 20 may be tested by a predetermined testing program stored in the external testing apparatus 10. For example, in cases where the DUT 20 is a DRAM, the external testing apparatus 10 transmits test information to emulate a writing operation synchronized with the operating frequency of the DRAM to the DRAM, and performs a reading operation to read out information stored in the DRAM in synchronization with the operating frequency of the DRAM. Next, the external testing apparatus 10 determines whether the DRAM is failed or not by comparing an expected value and information obtained from the reading operation.

However, in general, since precision of the waveform and speed of a test signal generated by the conventional external testing apparatus 10 are low relative to the operation frequency of the state of the art semiconductor devices operating at high speed and having high capacity, it is difficult to perform a reliable test with respect to the semiconductor devices. Due to recent increases in operation speed and capacities of these semiconductor devices, conventional external testing apparatuses are becoming outdated or unusable.

Since an external testing apparatus is a relatively expensive apparatus, it is economically beneficial to make use of an existing testing apparatus to test high performance semiconductor devices. As a technique to test high performance semiconductor devices by using a conventional external testing apparatus operating at a relative low speed, a technique to install a built in self test (BIST) circuit in semiconductor devices has been researched. However, the BIST circuit has a challenge to be applied to the semiconductor devices, since the BIST circuit increases the size of the semiconductor devices, and the additional process for fabricating the BIST circuit incurs increase in production costs of the semiconductor device.

SUMMARY

Exemplary embodiments of the present general inventive concept may be achieved by providing an economic and reliable testing apparatus to test semiconductor devices operating at a high speed by using a conventional external testing apparatus operating at a relative low speed.

Additional embodiments of the present general inventive concept will be set forth in part in the description which follows and, in part, will be obvious from the description, or may be learned by practice of the general inventive concept.

Example embodiments of the present general inventive concept may also be achieved by providing a built off testing apparatus coupled between a semiconductor device and an external testing apparatus to test the semiconductor device, the built off testing apparatus can include a frequency multiplying unit to generate a test clock frequency by multiplying the frequency of a clock input by the external testing apparatus according to the operation speed of the semiconductor device, an instruction decoding unit to generate test information by decoding test signals input by the external testing apparatus according to the test clock frequency, and a test execution unit to test the semiconductor device according to the test information, determines whether the semiconductor device is failed or not based on test data output by the semiconductor device, and transmits resulting data to the external testing apparatus.

The frequency multiplying unit may include a phase locked loop (PLL) frequency synthesis circuit. Furthermore, the test execution unit may include at least one finite state machine (FSM) that transmits test signals to the semiconductor device according to a stored testing program; and a comparing unit that generates the resulting data by comparing the test data and a stored expectation value.

The semiconductor device may be a wafer-level circuit, a chip-level circuit, or a package-level circuit. The semiconductor device may be a DDR memory device which may operate at high speed.

Example embodiments of the present general inventive concept may also be achieved by providing a built off testing apparatus coupled between a semiconductor device and an external testing apparatus to test the semiconductor device, the built off testing apparatus including a frequency multiplying unit to generate a test clock frequency by multiplying the frequency of a clock input by the external testing apparatus according to the operation speed of the semiconductor device, an instruction decoding unit to generate test information by decoding test signals input by the external testing apparatus according to the test clock frequency, at least one finite state machine (FSM) to transmit test signals to the semiconductor device according to a stored test program, and a comparing unit to determine whether the semiconductor device is failed based on test data output by the semiconductor device and transmits a resulting data to the external testing apparatus.

The built off testing apparatus may further include at least one of connection terminal and connection socket to connect the built off testing apparatus to the external testing apparatus and the semiconductor device.

Example embodiments of the present general inventive concept may also be achieved by providing a method of testing a semiconductor device, including generating a test signal frequency from a clock frequency of an external testing apparatus according to an operation speed of the semiconductor device, generating test information from a test signal of the external testing apparatus according to the test signal frequency, and inputting the test information to the semiconductor device according to the test signal frequency to determine whether the semiconductor device is failed.

The method may further include receiving result data from the semiconductor device based on the input test information, and transmitting the result data to the external testing apparatus according to the clock frequency of the external testing apparatus.

The method may further include comparing output values of the semiconductor device to expected output values according to the test signal frequency to determine whether the semiconductor device is failed.

The generating a test signal frequency may include multiplying the clock signal according to the operating speed of the semiconductor device.

The generating of test information may include decoding testing information of the external testing apparatus according to the test signal frequency.

Example embodiments of the present general inventive concept may also be achieved by providing a first unit to generate a first test signal frequency, and a second unit to generate a second test signal frequency from the first test frequency according to an operation speed of the semiconductor device, to transmit the second test signal frequency to the semiconductor device, and to receive a result signal from the semiconductor device based on the second test signal frequency to determine whether the semiconductor device is failed.

The testing unit can transmit the result signal to the first unit according to the first test signal frequency.

The second unit may include a comparing unit to compare output values from the semiconductor device to expected output values to determine whether the semiconductor device is failed.

The second unit may also include a frequency multiplier to multiply the first test signal frequency according to the operating speed of the semiconductor device.

The second unit may also include a decoding unit to decode the first test signal frequency according to the second test signal frequency.

BRIEF DESCRIPTION OF THE DRAWINGS

Exemplary embodiments of the present general inventive concept will be more clearly understood from the following detailed description taken in conjunction with the accompanying drawings in which.

DETAILED DESCRIPTION OF THE EMBODIMENTS

Figure 1:
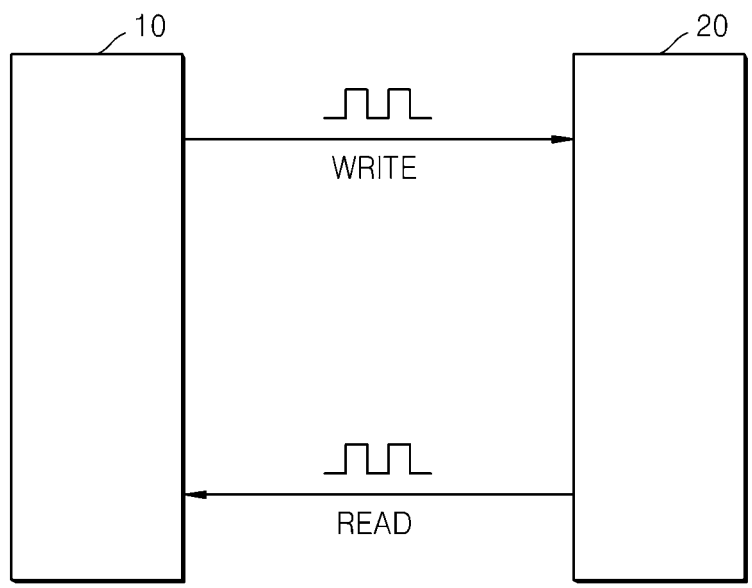
FIG. 1 is a block diagram of a conventional external testing apparatus.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures. The present general inventive concept may, however, be embodied in many different forms and should not be construed as being limited to the exemplary embodiments set forth herein.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

Figure 2:
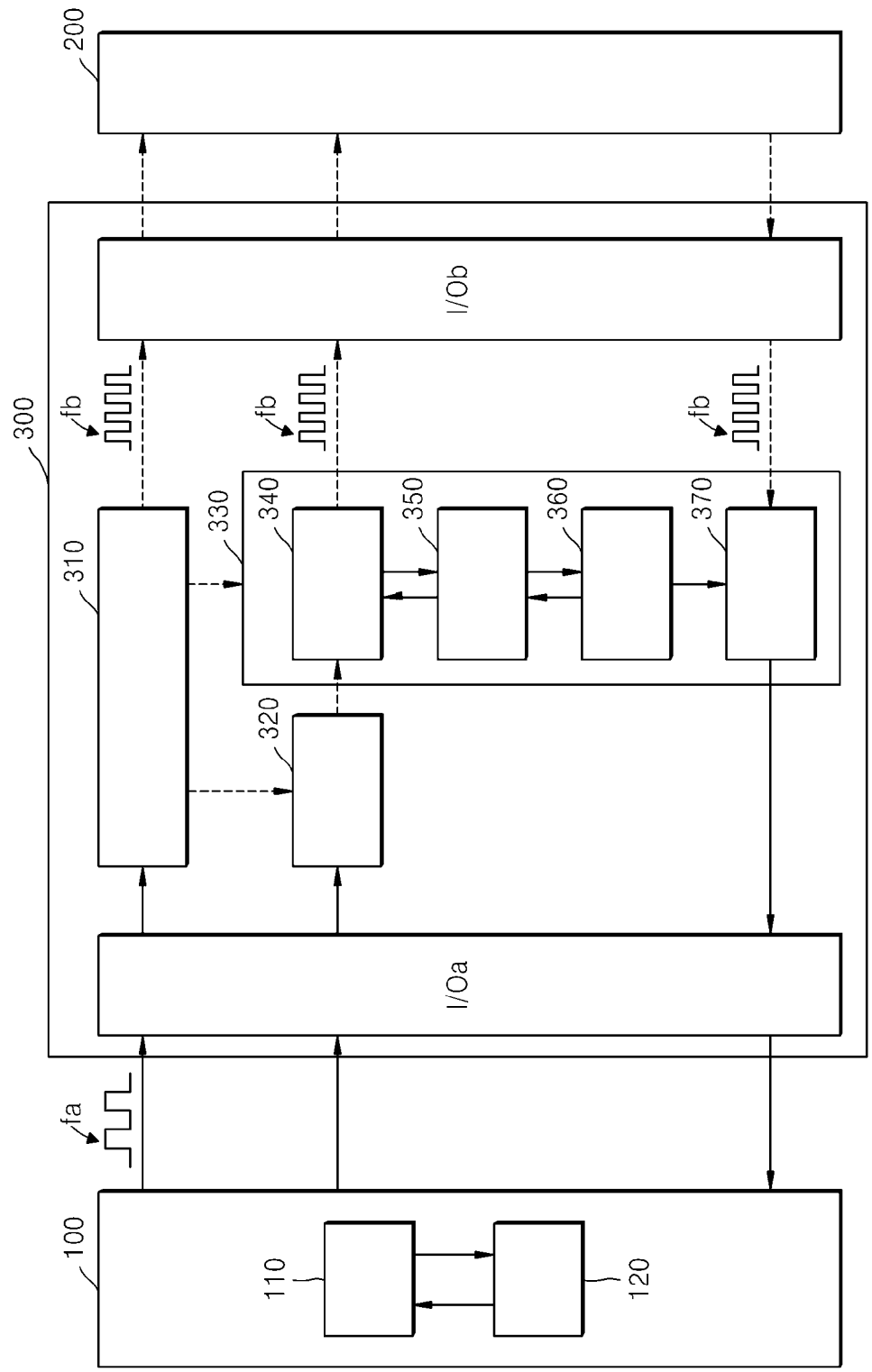
FIG. 2 is a block diagram of a built off testing apparatus according to an example embodiment of the present general inventive concept.

FIG. 2 is a block diagram of a built off testing apparatus 300 according to an example embodiment of the present general inventive concept.

Referring to FIG. 2, an external testing apparatus 100 may be a conventional testing apparatus operating at low speed (referred to as low-speed testing apparatus herein after). The external testing apparatus 100 may include a main frame unit 110 to generate a predetermined test signal and to transmit the test signal to a semiconductor device 200 according to programmed sequences, and a head unit 120 to receive test data output from the semiconductor device 200. The semiconductor device 200 can be referred to as a device under test (DUT), and may be a graphic processor, a microprocessor, a memory device such as a dynamic random access memory (DRAM) or a flash memory, or a combination thereof, such as a system-on-chip. Furthermore, it is possible that the semiconductor device 200 may be a wafer-level circuit, a chip-level circuit, or a package-level circuit.

In cases where the semiconductor device 200 includes a high speed memory circuit (e.g., double-data-rate synchronous dynamic random access memory (DDR SDRAM)), the test signal output from the external testing apparatus 100 may include a clock CLK, an address ADDR, data DQs, and control signals /RAS, /CAS, and DQS. However, the test signals stated above are mere examples, and the test signal may simply include a test initiating signal to initiate a testing operation of the built off testing apparatus 300, as described below.

As illustrated in FIG. 2, a built off testing apparatus 300 according to an example embodiment of the present general inventive concept may be coupled between the external testing apparatus 100 and the semiconductor device 200. In the example embodiment of FIG. 2, the built off testing apparatus 300 may include input and output units I/Oa and 1/Ob to respectively input and output signals between the external testing apparatus 100 and the semiconductor device 200. The input and output units 1/Oa and 1/Ob may include at least one connection terminal and at least one connection socket to be connected to the external testing apparatus 100 and the semiconductor device 200, respectively. For example, the input and output unit 1/Ob may be connected to the semiconductor device 200 via pogo pins.

The exemplary built off testing apparatus 300 may include a frequency multiplying unit 310, an instruction decoding unit 320, and a test execution unit 330. The frequency multiplying unit 310 may generate a test clock frequency fb by multiplying a test clock frequency fa input by the external testing apparatus 100 according to the operation speed of the semiconductor device 200.

The frequency multiplying unit 310 may be implemented by a phase locked loop (PLL) frequency synthesis circuit, for example. The PLL frequency synthesis circuit may include a frequency divider to divide the test clock frequency fa input by the external testing apparatus 100 according to a predetermined division ratio, a frequency multiplier to multiply the frequency of the frequency-divided signal input by the frequency divider, and a voltage controlled oscillator to generate a test clock frequency fb in response to a signal input by the frequency multiplier. The semiconductor device 200 may be tested according to the test clock frequency fb generated by the frequency multiplying unit 310.

The instruction decoding unit 320 can generate second test information by decoding first test information input by the external testing apparatus 100 and can transmit the generated second test information to the test execution unit 330. The text execution unit 330 can test the semiconductor device 200 according to the second test information, can determine whether the semiconductor device 200 is failed based on test data output by the semiconductor device 200, and can transmit the resulting data of the test to the external testing apparatus 100 via the input and output unit I/Oa.

The test execution unit 330 may include a finite state machine (FSM) 340. For example, it is possible that the FSM 340 can include a circuit to generate an output value based on a current value of an input value and a previous value of the input value. The FSM 340 can be synchronized to the test clock frequency fb output by the frequency multiplying unit 310 and can make the state of the semiconductor device 200 change sequentially according to a predetermined testing mode. The exemplary FSM 340 of the present general inventive concept may have a plurality of states, for example, n states, and each state can be either maintained or shifted to a next state according to conditions (or control signals).

Figure 3:
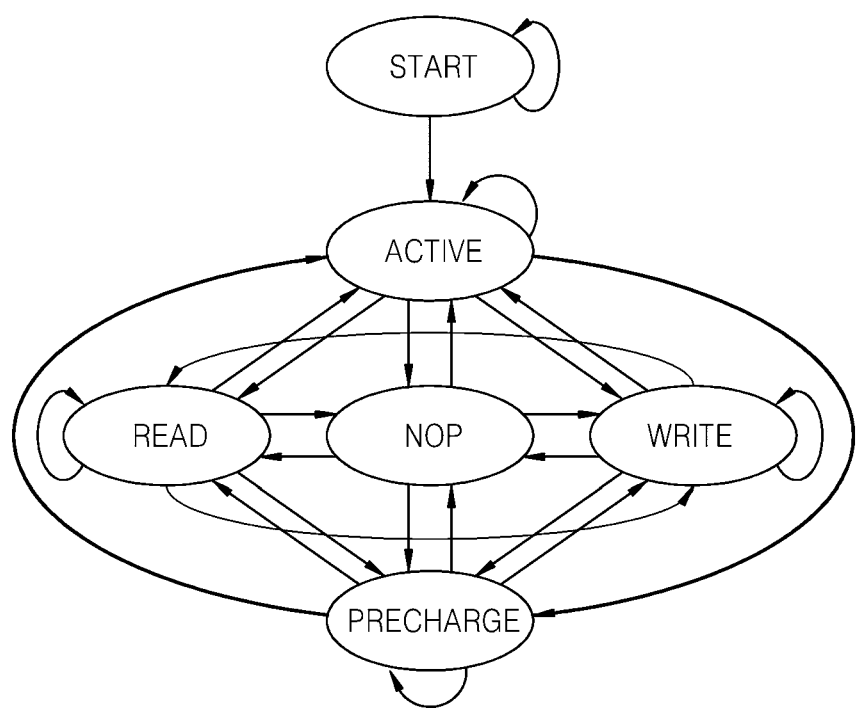
FIG. 3 illustrates a state transition diagram of a FSM for a DRAM as the semiconductor device to be tested.

For example, each of the (n) states may be defined to correspond to each of predetermined operation modes of the semiconductor device 200 to be tested, wherein the operations modes may have a collective meaning determined by classifying various operations of the semiconductor device 200. FIG. 3 illustrates an exemplary state transition diagram of a FSM for a DRAM as the semiconductor device to be tested.

Referring to FIG. 3, no operation (NOP), activation (for example, activation of wordlines of a specific memory bank (ACTIVE)), memory read command (READ), memory write command (WRITE), and precharging of all banks (PRECHARGE) may be defined as respective operation modes of a DRAM. The basic operation modes of a DRAM listed above may be referred to in "Semiconductor Memories Technology, Testing and Reliability," written by A. K. Sharma and published by IEEE press in 1996.

The arrows in FIG. 3 indicate interstate transitions according to fulfilment of respective conditions. For example, a basic reading operation of a memory cell of a DRAM may be performed in the sequence of ACTIVE, NOP, READ, NOP, and PRECHARGE. A basic writing operation of a memory cell of a DRAM may be performed in the sequence of ACTIVE, NOP, WRITE, NOP, and PRECHARGE. Furthermore, basic reading/writing operations of a memory cell may include an interleaving mode or a pipeline mode as known in the art. A MARCH test pattern or a REFRESH test pattern may be tested by using the FSM 340.

Although only one FSM 340 is illustrated in FIG. 3, the example embodiments of the present general inventive concept are not limited thereto, and it is possible that the test execution unit 330 may include two or more FSMs to perform two or more different sets of tests.

Moreover, in the example embodiments of the present general inventive concept, since the semiconductor device 200 can be tested by using the FSM 340, each state of testing the semiconductor device can be shifted to another state under state transition conditions, and thus comparative operations other than to test the state transition condition may not be required. Thus, the testing of the FSM 340 can be clearly defined, thereby improving stability of the built off testing apparatus and reliability of a test result. Furthermore, while a conventional built off testing apparatus which uses memory typically requires a significant amount of channel resource of the external testing apparatus 100, the FSM according to example embodiments of the present general inventive concept may use less resources of the external testing apparatus 100, making it possible to implement a parallel process by dividing channels of the external testing apparatus 100.

Referring again to FIG. 2, the test execution unit 330 may include a control unit 350 to control the FSM 340 and a stored expectation value 360. A comparing unit 370 can compare test data obtained from a result of testing the semiconductor device 200 using the FSM 340 and the stored expectation value 360 to determine whether the semiconductor device 200 is failed, and the resulting data can be output to the external testing apparatus 100. In this case, the resulting data may be transmitted to the external testing apparatus 1 pp at a reduced frequency equal to the operating frequency of the external testing apparatus 100.

It is possible that the built off testing apparatus 300 of the present general inventive concept may also be applied to a semiconductor device 200 provided with a conventional BIST circuit.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A built off testing apparatus coupled between a semiconductor device and an external testing apparatus to test the semiconductor device, the built off testing apparatus comprising:

a frequency multiplying unit to generate a test clock frequency by multiplying the frequency of a clock input by the external testing apparatus according to the operation speed of the semiconductor device;

an instruction decoding unit to generate test information by decoding test signals input by the external testing apparatus according to the test clock frequency; and a test execution unit to test the semiconductor device according to the test information, to determine whether the semiconductor device is failed based on test data output by the semiconductor device, and to transmit resulting data to the external testing apparatus, wherein channels of the external testing apparatus are divided to perform a plurality of tests in parallel by two or more built off testing apparatuses.

2. The built off testing apparatus of claim 1, wherein the frequency multiplying unit comprises a phase locked loop (PLL) frequency synthesis circuit.

3. The built off testing apparatus of claim 1, wherein the test execution unit comprises:
    at least one finite state machine (FSM) to transmit test signals to the semiconductor device according to a stored testing program; and
    a comparing unit to generate the resulting data by comparing the test data and a stored expectation value.

4. The built off testing apparatus of claim 1, wherein the semiconductor device is a wafer-level circuit, a chip-level circuit, or a package-level circuit.

5. The built off testing apparatus of claim 1, wherein the semiconductor device comprises a graphic processor, a microprocessor, a memory device, or a combination thereof.

6. A built off testing apparatus coupled between a semiconductor device and an external testing apparatus to test the semiconductor device, the built off testing apparatus comprising:
    a frequency multiplying unit to generate a test clock frequency by multiplying the frequency of a clock input by the external testing apparatus according to the operation speed of the semiconductor device;
    an instruction decoding unit to generate test information by decoding test signals input by the external testing apparatus according to the test clock frequency;
    at least one finite state machine (FSM) to transmit test signals to the semiconductor device according to a stored test program; and
    a comparing unit to determine whether the semiconductor device is failed based on test data output by the semiconductor device and to transmit a resulting data to the external testing apparatus.

7. The built off testing apparatus of claim 6, further comprising at least one of a connection terminal and a connection socket to connect the built off testing apparatus to the external testing apparatus and the semiconductor device.

8. The built off testing apparatus of claim 6, wherein the semiconductor device is a wafer-level circuit, a chip-level circuit, or a package-level circuit.

9. The built off testing apparatus of claim 6, wherein the semiconductor device comprises a graphic processor, a microprocessor, a memory device, or a combination thereof.

* * * * *